United States Patent [19]

Appleby

[11] 4,454,372
[45] Jun. 12, 1984

[54] PHOTOVOLTAIC BATTERY

[75] Inventor: Anthony J. Appleby, Mountain View, Calif.

[73] Assignee: Electric Power Research Institute, Inc., Palo Alto, Calif.

[21] Appl. No.: 255,312

[22] Filed: Apr. 17, 1981

[51] Int. Cl.³ .............................................. H01L 31/06
[52] U.S. Cl. .................................................... 136/250
[58] Field of Search ........................................ 136/250

[56] References Cited

U.S. PATENT DOCUMENTS

| | | | |
|---|---|---|---|
| 2,904,613 | 9/1959 | Paradise | 136/250 |
| 3,025,335 | 3/1962 | Ralph | 136/250 |
| 3,038,952 | 6/1962 | Ralph | 29/572 |
| 3,370,986 | 2/1968 | Amsterdam et al. | 136/244 |
| 3,998,659 | 12/1974 | Wakefield | 136/250 |
| 4,173,494 | 11/1979 | Johnson et al. | 136/250 |
| 4,315,096 | 2/1982 | Tyan et al. | 136/244 |

Primary Examiner—Aaron Weisstuch
Attorney, Agent, or Firm—Flehr, Hohbach, Test, Albritton & Herbert

[57] ABSTRACT

A photovoltaic cell in which a plurality of semiconductor bodies are provided on a conductive layer on a major surface of a substrate. Each body includes a core and an outer layer of different conductivity types. A transparent conductive layer interconnects the semiconductor bodies. In one embodiment a single conductive layer is formed on the substrate, and a voltage differential is generated between the signal conductive layer and the transparent conductive layer. Alternatively, two conductive layers can be provided on the substrate and the voltage differential is generated between the two conductive layers.

1 Claim, 6 Drawing Figures

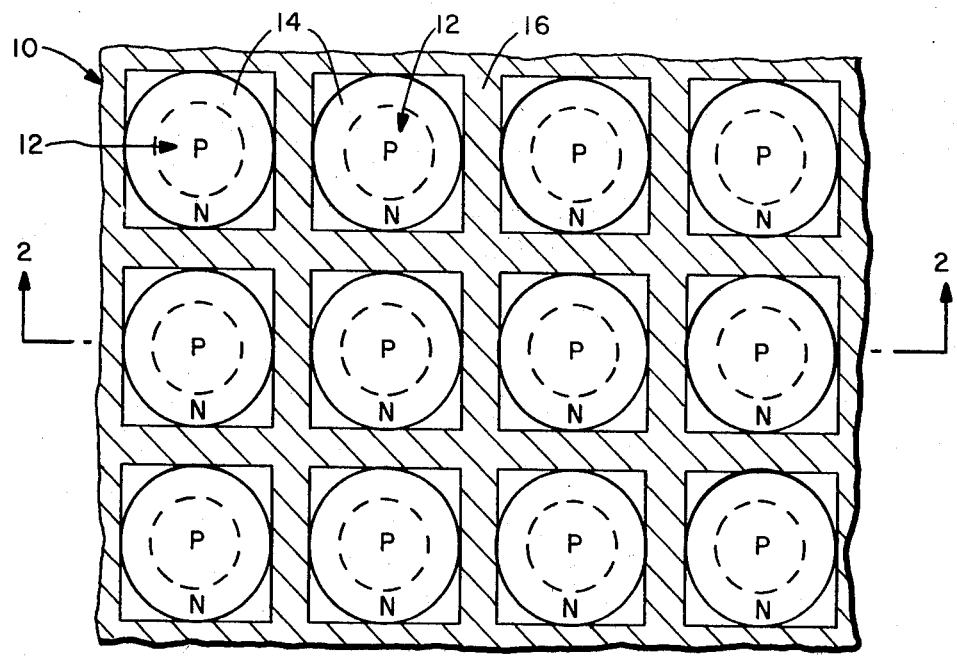
FIG.—1
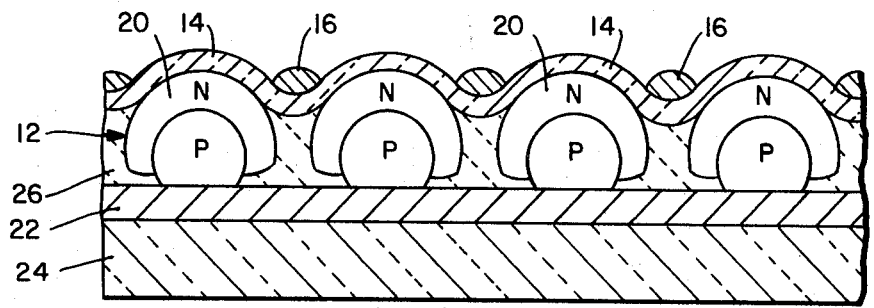
FIG.—2A
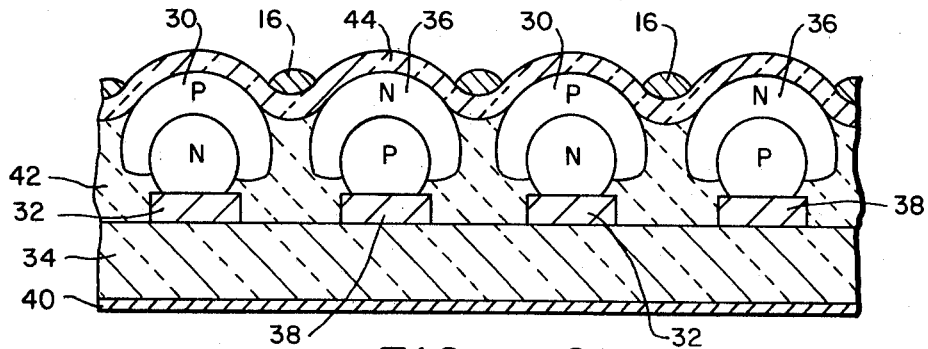
FIG.—2B

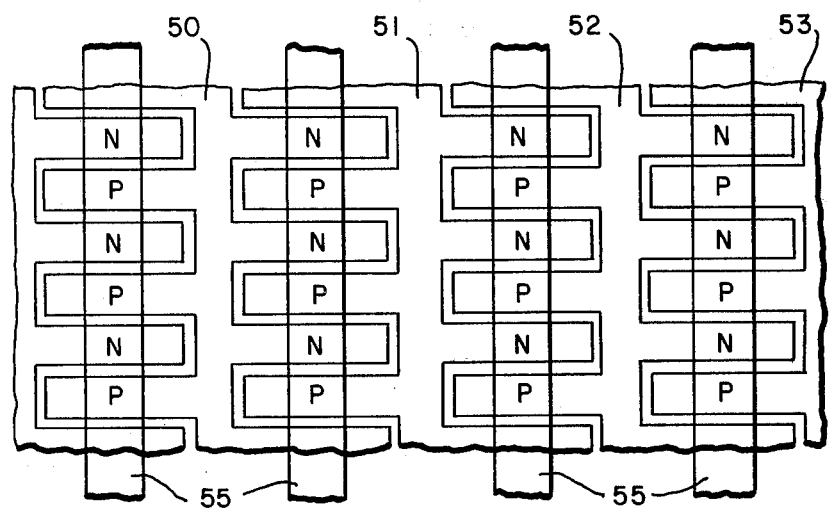
FIG.—3A
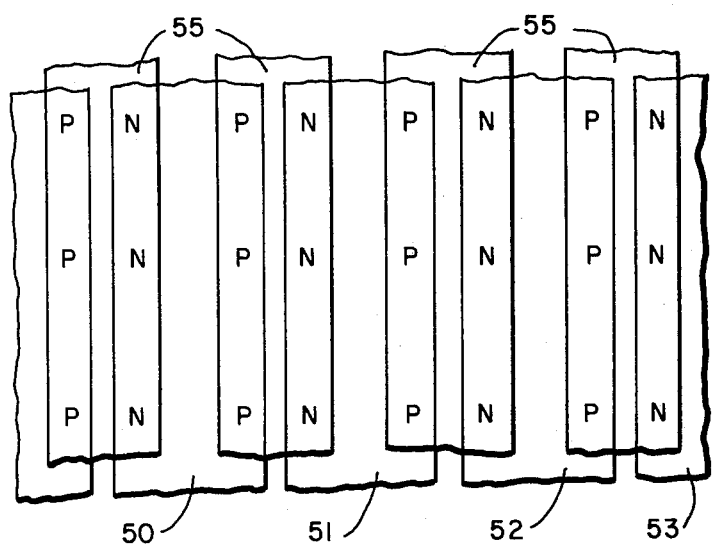
FIG.—3B
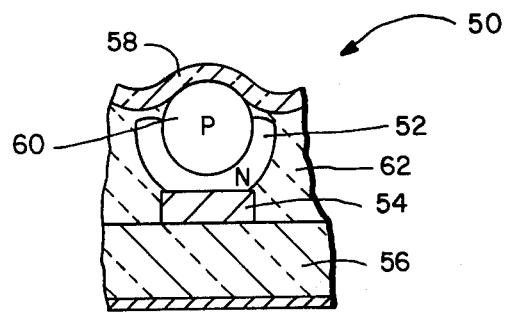
FIG.—4

PHOTOVOLTAIC BATTERY

This invention relates generally to semiconductor technology and devices, and more particularly the invention relates to semiconductor photovoltaic cells.

Semiconductor photovoltaic devices are known which respond to solar radiation and generate an electrical charge or current. The silicon cell as employed in solar batteries has a p-n junction across which a voltage differential is developed in response to impinging photons. Heretofore, manufacturing costs of the silicon cell and the low conversion efficiency thereof have limited utility of the silicon cell.

In recent years, the solar cell has been proposed for use in producing chemical energy rather than electrical energy. For example, such a cell may be in permanent contact with an electrolytic solution, and an electrical current generated by the solar cell and flowing through the electrolytic solution produces chemical products. At least one of the chemical products may typically be in gaseous form, and the chemicals evolving from the solar cell can be captured for subsequent use in thermal conversion or in a fuel cell device where the chemicals are recombined to generate an electrical current.

U.S. Pat. No. 4,021,323 discloses a solar energy conversion system in which doped silicon beads are placed in contact with a solution whose decomposition potential is sufficiently low so that the solution can be efficiently photodecomposed with the chemicals stored and later recombined in a fuel cell. U.S. Pat. No. 4,173,494 describes techniques for fabricating devices of the type disclosed in U.S. Pat. No. 4,021,323 and particularly the method of forming discrete semiconductor bodies including a core of first conductivity type and an outer layer of second conductivity type. The cores and outer layers of a mixture of particles of different core conductivity type contact an insulated conductive layer and an electrolytic solution in the devices whereby a voltage potential is produced across the electrolyte so that chemical species are produced by its decomposition.

Copending application Ser. No. 205,617, filed Nov. 10, 1980, assigned to the present assignee, now U.S. Pat. No. 4,357,400, discloses a photovoltaic cell employing discrete semiconductor bodies, similar to the structures in U.S. Pat. No. 4,021,323, and 4,136,436, and which is used with an electrolytic solution for generating electrical energy. A plurality of discrete semiconductor bodies are positioned on two conductive layers whereby radiation is transmitted through the electrolytic material to the semiconductor bodies to create a voltage differential and whereby the electrolytic material provides a conductive path between the semiconductor bodies.

An object of the present invention is an improved photovoltaic cell.

Another object of the invention is a photovoltaic cell comprising a plurality of discrete semiconductor bodies without the requirement for an electrolytic solution.

A feature of the invention is the use of a transparent conductive layer overlying and electrically interconnecting a plurality of discrete semiconductor bodies with each of the semiconductor bodies comprising a first region of first conductivity type and a second region of second conductivity type which define a PN junction.

Briefly, in accordance with a first embodiment of the invention a photovoltaic cell comprises a substrate with a first conductive layer on a major surface of the substrate. A plurality of discrete semiconductor bodies are positioned on the first conductive layer with each of the discrete bodies including a first region of first conductivity type and a second region of second conductivity type with the first and second regions defining a p-n junction. The first region of each semiconductor body abuts the first conductive layer. A second, transparent conductive layer overlies the plurality of discrete semiconductor bodies and electrically interconnects the second regions whereby photons impinging on the semiconductor bodies generate a voltage between the first and second conductive layers.

In accordance with an alternative embodiment of the invention a substrate is provided with a first conductive layer and a second conductive layer on a major surface with the first and second conductive layers being spaced from each other. A first plurality of discrete semiconductor devices are positioned on each of the first conductive layers with each of the first plurality of discrete semiconductor devices including a first region of first conductivity type and a second region of a second conductivity type. The first region of the first plurality of discrete semiconductor bodies abuts the first conductive layer. A second plurality of discrete semiconductor bodies is positioned on the second conductive layer, with each of the second plurality of discrete semiconductor bodies including a first region of said first conductivity type and a second region of said second conductivity type with the second region of the second plurality of bodies abutting the second conductive layer. A third, transparent conductive layer overlies the first and second pluralities of discrete semiconductor bodies and electrically interconnects the second regions of the first plurality of bodies with the first regions of the second plurality of semiconductor bodies whereby photons impinging on the semiconductor bodies generate a voltage between the first conductive layer and the second conductive layer formed on the major surface of the substrate.

In either embodiment, an insulative material such as glass is preferably provided over the major surface between the plurality of discrete semiconductor devices.

The invention and objects and features thereof will be more readily apparent from the following detailed description and appended claims when taken with the drawing, in which:

FIG. 1 is a plan view of a portion of a photovoltaic cell in accordance with one embodiment of the invention.

FIG. 2A is a section view of the photovoltaic cell of FIG. 1 taken along the line 2—2.

FIG. 2B is a section view of an alternative embodiment of a photovoltaic cell taken along the line 2—2 of FIG. 1.

FIGS. 3A and 3B are plan views of portions of solar panels using the photovoltaic cells of FIG. 2B.

FIG. 4 is a section view of an alternative embodiment of the semiconductor bodies for use in the photovoltaic cell of FIG. 1.

Referring now to the drawings, FIG. 1 is a top view of a portion of a photovoltaic cell in accordance with the invention and includes a plurality of generally spherical semiconductor bodies 12 which are supported by a substrate with an overlying layer of conductive material 14 contacting and electrically connecting the semiconductor bodies 12. Preferably, the conductive layer 14 is a material such as tin oxide which is transparent to photons. In one embodiment of the invention a conductive grid 16 of aluminum or other low resistance material is provided over the conductive layer 14 with the grid pattern provided between adjacent semiconductor bodies 12. The grid patttern 16 is advantageous when the overlying conductive layer 14 functions as one terminal of the photovoltaic cells, as will be described with reference to FIG. 2A.

FIG. 2A is a section view of the photovoltaic cell of FIG. 1 taken along the line 2—2 in which each of the semiconductor bodies 12 comprises a first region 18 of P type conductivity and an overlying layer 20 of N type conductivity. Each of the spheres is positioned on a conductive layer 22 such as aluminum on a major surface of a supporting substrate 24 such as glass or a ceramic. An insulative material 26, such as glass, is provided over the surface of the conductive layer 22 between the semiconductor bodies 12.

Photons transmitted through the transparent conductive layer 14 and impinging on the semiconductor bodies 12 generate an electrical potential between the conductive layers 14 and 16 (negative) and the conductive layer 22 (positive). The device is similar to the photovoltaic cells shown and described in copending application Ser. No. 205,617, supra, except that the electrolytic solution utilized in the device disclosed in the copending application is replaced by the transparent conductive layer 14.

FIG. 2B is a sectional view of an alternative embodiment of the device of FIG. 1 taken along the line 2—2 and in which the grid 16 is not required. In accordance with this embodiment a first plurality of semiconductor bodies 30 having an N type conductivity core and an overlying P layer are mounted on a first plurality of interconnected conductive layers 32 on the surface of a substrate 34 with the N conductivity cores in contact with the conductive layers 32. A second plurality of discrete semiconductor bodies 36 having a P type core and an N type outer layer are positioned on a second plurality of interconnected conductive layers 38 on the surface of substrate 34 with the P type material abutting the conductive layers 38. The conductive layers 32 and 38 are spaced from each other on the surface of the substrate. A thin layer of reflective material 40 can be provided on the opposite surface as substrate 34 to reflect photons back to the semiconductor bodies 30, 36.

Again, an insulative material 42 such as glass is provided on the surface of the transparent base plate 34 between the semiconductor bodies 30, 36, and a transparent conductive layer 44 such as tin oxide is provided over the surfaces of the semiconductor bodies 30 and 36. In this embodiment photons transmitted through the conductive layer 44 impinge on the semiconductor devices and create a voltage differential between the conductors 32 (negative) and the conductors 38 (positive). The devices as shown in FIGS. 2A and 2B can be fabricated in accordance with the teachings of copending application No. 205,617 and U.S. Pat. No. 4,136,436.

FIGS. 3A and 3B are plan views of portions of solar panels using the photovoltaic cells of FIGS. 2B. In FIG. 3A interdigitated conductive layers 50, 51, 52, and 53 are provided on an insulative substrate with the P conductive core semiconductor bodies provided on the left extension of each conductive layer, and the N conductive core semiconductor bodies provided on the right extensions of each conductive core. Each conductive layer then becomes a cell of the solar panel. A transparent conductive film 55 such as tin oxide then serially interconnects adjacent cells.

FIG. 3B is similar to FIG. 3A and the same reference numerals are used for like elements. However, in this embodiment the conductive layers 50, 51, 52 and 53 are not interdigitated.

FIG. 4 is a section view of a semiconductor body illustrating an alternative construction of the photovoltaic cells. This embodiment is similar to that illustrated in FIG. 2B but with the outer layer 62 of the semiconductor body 60 abutting the conductive layer 64 on substrate 66 and the transparent conductive material 68 abutting the P type core material 70. Again, an insulative material 72 such as glass is provided on the surface of the substrate 66 between the semiconductor bodies 60. After affixing the semiconductor bodies to the conductive layers on the substrate, an etchant is applied to remove the outer N type layer away from the conductive layer. Glass insulation is then provided to seal the N type layer before the tin oxide layer 68 is formed. An advantage of the structure in accordance with FIG. 4 lies in the internal reflectivity of each semiconductor body which further enhances the conversion of the photons to electrical energy. Accordingly, a greater conversion efficiency is realized with this structure.

Photovoltaic cells and solar panels in accordance with the invention are readily constructed and obviate the need for an electrolytic solution. While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A photovoltaic battery comprising
   a substrate,
   a plurality of conductive layers formed on a major surface of said substrate, said plurality of conductive layers being alternately interdigitatedly arranged and spaced from each other,
   a plurality of first type discrete semiconductor bodies positioned on one side of each of said plurality of conductive layers, each of said plurality of first type discrete semiconductor bodies including a first region of a first conductivity type and a second region of a second conductivity type, said first and second regions defining a PN junction, said first region contacting one of said conductive layers,
   a plurality of second type discrete semiconductor bodies positioned on an opposite side of each of said pluralities of conductive layers, each of said plurality of second type discrete semiconductor bodies including a first region of said first conductivity type and a second region of said second conductivity type, said first and second regions defining a PN junction, said second region contacting one of said conductive layers,
   a plurality of third type transparent conductive layers overlying said pluralities of first and second type discrete semiconductor bodies and electrically interconnecting said second regions of said plurality of first type semiconductor bodies and said first regions of said plurality of second type semiconductor bodies whereby photons impinging on said semiconductor bodies generate a voltage between adjacent ones of said plurality of conductive layers.

* * * * *